(12) United States Patent
Voshell et al.

(10) Patent No.: US 8,431,980 B2
(45) Date of Patent: *Apr. 30, 2013

(54) RANDOM ACCESS MEMORY DEVICE UTILIZING A VERTICALLY ORIENTED SELECT TRANSISTOR

(75) Inventors: Thomas W. Voshell, Boise, ID (US); Lucien J. Bissey, Boise, ID (US); Kevin G. Duesman, Boise, ID (US)

(73) Assignee: Micron Technology, Inc., Boise, ID (US)

(*) Notice: Subject to any disclaimer, the term of this patent is extended or adjusted under 35 U.S.C. 154(b) by 298 days.

This patent is subject to a terminal disclaimer.

(21) Appl. No.: 12/834,382

(22) Filed: Jul. 12, 2010

(65) Prior Publication Data

US 2010/0276742 A1    Nov. 4, 2010

Related U.S. Application Data

(60) Continuation of application No. 11/708,616, filed on Feb. 21, 2007, now Pat. No. 7,777,264, which is a division of application No. 10/637,557, filed on Aug. 11, 2003, now Pat. No. 7,205,598, which is a continuation-in-part of application No. 10/230,568, filed on Aug. 29, 2002, now Pat. No. 6,794,699.

(51) Int. Cl.
*H01L 27/108* (2006.01)

(52) U.S. Cl.
USPC ............................................ 257/301; 257/296

(58) Field of Classification Search .................. 257/301, 257/296
See application file for complete search history.

(56) References Cited

U.S. PATENT DOCUMENTS

| | | | |
|---|---|---|---|
| 5,244,824 A | 9/1993 | Sivan | |
| 6,309,919 B1 | 10/2001 | Liu et al. | |
| 6,316,309 B1 | 11/2001 | Holmes et al. | |
| 6,317,357 B1 | 11/2001 | Forbes | |
| 6,326,275 B1 | 12/2001 | Harrington et al. | |
| 6,335,239 B1 | 1/2002 | Agahi et al. | |
| 6,350,635 B1 | 2/2002 | Noble et al. | |
| 6,358,756 B1 | 3/2002 | Sandhu et al. | |
| 6,399,979 B1 | 6/2002 | Noble et al. | |
| 6,418,050 B2 | 7/2002 | Forbes | |
| 6,449,186 B2 | 9/2002 | Noble | |
| 6,498,065 B1 | 12/2002 | Forbes et al. | |
| 6,504,201 B1 | 1/2003 | Noble et al. | |
| 6,794,699 B2 * | 9/2004 | Bissey et al. | 257/296 |
| 7,205,598 B2 * | 4/2007 | Voshell et al. | 257/301 |
| 7,777,264 B2 * | 8/2010 | Voshell et al. | 257/296 |
| 2004/0264240 A1 | 12/2004 | Hineman et al. | |

OTHER PUBLICATIONS

J.A. Mandelman et al., "Challenges and future directions for the scaling of dynamic rand-access memory (DRAM)," © IBM 0018-8646, 2002, 26 pages.

* cited by examiner

*Primary Examiner* — Long Pham
(74) *Attorney, Agent, or Firm* — Dickstein Shapiro LLP

(57) ABSTRACT

A memory structure has a vertically oriented access transistor with an annular gate region. A transistor is fabricated such that the channel of the transistor extends outward with respect to the surface of the substrate. An annular gate is fabricated around the vertical channel such that it partially or completely surrounds the channel. A buried annular bitline may also be implemented. After the vertically oriented transistor is fabricated with the annular gate, a storage device may be fabricated over the transistor to provide a memory cell.

20 Claims, 8 Drawing Sheets

RANDOM ACCESS MEMORY DEVICE UTILIZING A VERTICALLY ORIENTED SELECT TRANSISTOR

RELATED APPLICATIONS

This application is a continuation of U.S. patent application Ser. No. 11/708,616, filed on Feb. 21, 2007, now U.S. Pat. No. 7,777,264, which is a divisional of U.S. patent application Ser. No. 10/637,557, filed on Aug. 11, 2003 (now U.S. Pat. No. 7,205,598, issued Apr. 17, 2007), which is a continuation-in-part of U.S. patent application Ser. No. 10/230,568 filed Aug. 29, 2002 (now U.S. Pat. No. 6,794,699, issued Sep. 21, 2004), the subject matters of which are incorporated in their entirety by reference.

BACKGROUND OF THE INVENTION

1. Field of the Invention

The present invention relates to memory devices, and more specifically, to random access memory devices having vertical access transistors.

2. Description of the Related Art

Semiconductor memory devices are widely used for storing data in systems such as computer systems. Random access memory devices include dynamic random access memory (DRAM), magnetic random access memory (MRAM) and programmable conductor random access memory (PCRAM) memory cells that are being developed for non-volatile data storage in computers and other information processing devices.

A DRAM cell typically includes an access device, such as a field effect transistor (FET), which is coupled to a storage device, such as a capacitor. The access device allows the transfer of charges to and from the storage capacitor, thereby facilitating read and write operations in the memory cell. The memory cells typically are arranged in a number of rows and columns to provide a memory array. DRAM cells require continual refreshing.

Recent developments in memory include MRAM and PCRAM devices. MRAM memory cells are vertical stacks of thin films with certain magnetic and conductive interactive properties. An array of these cells forms a row and column addressable memory array. Bitwise information is stored in each cell based on the relative orientation of magnetic moments in thin films of the cell. Magnetic tunnel junctions are examples of the type of thin film structures used in magnetic memory cells.

A PCRAM memory cell utilizes silver electromigration through a glass to form a contact when an electrical potential is applied across the plates of the cell. The contact may be broken by reversing the polarity of the potential and allowing reverse current to flow until the silver migrates back and breaks the connection.

MRAM and PCRAM do not require dynamic refreshing as does DRAM, and can be implemented without using a cell access transistor. Accordingly, MRAM arrays can be produced more efficiently (more bits per unit area) than DRAM. The lack of an access transistor, however, exposes MRAM cells to "sneak" currents through unselected cells, which requires compensation by sense circuitry in order to isolate the selected MRAM cell.

Memory cells, such as MRAM and PCRAM cells, would benefit from having an access transistor that would allow array efficiency to be preserved, while providing current isolation of the cells.

With the constantly increasing demand for higher data storage capacity, memory arrays are becoming more dense. Memory density typically is limited by current processing technologies used for fabricating the memory arrays. Thus, it also is desirable to increase memory density.

BRIEF SUMMARY OF THE INVENTION

The present invention provides higher density memory arrays using vertical technology in fabricating the access transistors to provide memory bits with minimal leakage, thereby preventing the loss of storage cell data while preserving array efficiency. Further, alpha-particle induced soft errors that alter the data stored in the memory cells are reduced and simplified fabrication techniques also are provided.

BRIEF DESCRIPTION OF THE DRAWINGS

The foregoing and other advantages of the invention will become more apparent from the detailed description of exemplary embodiments provided below with reference to the accompanying drawings in which.

DETAILED DESCRIPTION OF THE INVENTION

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The terms "wafer" and "substrate" are to be understood as interchangeable and as including silicon, silicon-on-insulator (SOI) or silicon-on-sapphire (SOS), doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions, junctions or material layers in or on the base semiconductor structure or foundation. In addition, the semiconductor need not be silicon-based, but could be based on silicon-germanium, germanium, gallium arsenide, or other known semiconductor materials.

Figure 1:
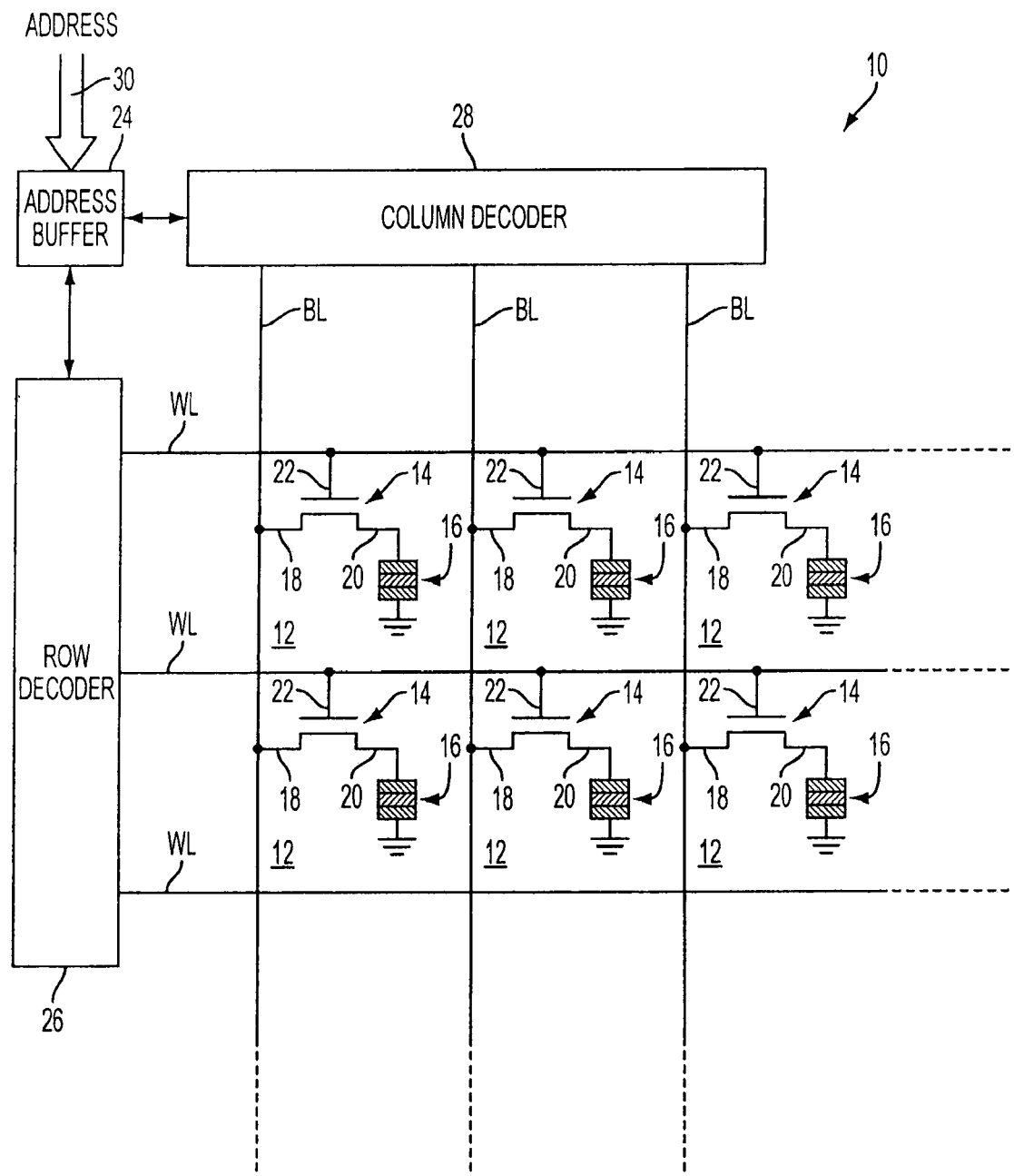
FIG. 1 is a partial schematic illustrating an integrated memory device circuit according to the present invention.

FIG. 1 is a partial schematic illustrating an integrated circuit, such as a memory device 10, incorporating an array of memory cells which may be fabricated in accordance with an exemplary embodiment of the present invention. The memory device 10 may be an MRAM device or a PCRAM device, for example. In the exemplary embodiment, the memory device 10 includes a number of memory bits 12 arranged in a grid pattern comprising a number of rows and columns. As can be appreciated, the number of memory cells (and corresponding rows and columns) may vary depending on system requirements and fabrication technology. Each memory bit 12 includes an access device and a storage device. In the present exemplary embodiment, the access device comprises a field-effect transistor (FET) 14 and the storage device comprises memory cell 16. The access device 14 is implemented to provide controlled access to the memory cell 16. In the exemplary memory bit 12, the FET 14 includes a drain terminal 18 and a source terminal 20, along with a gate terminal 22 for controlling conduction between the drain and source terminals 18, 20. The memory cell 16 is coupled between one of the source/drain terminals 18, 20 and a reference voltage (illustrated as a ground potential).

It should be noted that although the above description depicts the terminal of the access device that is coupled to the memory cell 16 as the source 20 and the other non-gate terminal of the access device as the drain 18, during read and write operations, the FET 14 may be operated such that each of the terminals 18, 20 operates at one time or another as a source or a drain. Accordingly, for purposes of further discussion, it should be recognized that whenever a terminal is identified as a source or a drain, it is only for convenience purposes. Thus, during operation of the FET 14 either terminal could be a source or a drain depending on the manner in which the FET 14 is being controlled by the voltages applied to the terminals 18, 20, 22 of the FET 14.

As previously described, the memory array of device 10 is arranged in a series of rows and columns. To implement data storage capabilities in each memory bit 12, an electrical charge is placed on the drain 18 of the FET 14 via a corresponding bitline (BL). By controlling the voltage at the gate 22 via the wordline (WL), a voltage potential may be created across the FET 14 such that the electrical charge at the drain 18 can flow to the memory cell 16.

The bitlines BL are used to read from, and write data to, the memory bits 12. The wordlines WL are used to activate the FET 14 to access a particular row of memory bits 12. The memory device 10 includes an address buffer 24, a row decoder 26, and column decoder 28 to control the wordlines WL and bitlines BL. The address buffer 24 controls the row decoder 26 and the column decoder 28 such that the row decoder 26 and column decoder 28 selectively access memory bits 12 in response to address signals provided on the address bus 30 during read and write operations. The address signals are typically provided by an external controller such as a microprocessor or other memory controller. The column decoder 28 may also include sense amplifiers and input/output circuitry to further enable data to be read from and written to the memory bits 12 via the bitlines BL.

In one exemplary mode of operation, the memory device 10 receives an address of a particular memory bit 12 at the address buffer 24. The address buffer 24 passes a row address to the row decoder 26 and a column address to the column decoder 28. The row decoder 26 selectively activates a particular wordline WL to activate the FETs 14 of each memory bit 12 connected to the selected wordline WL. The column decoder 28 selects the bitline (or bitlines) BL of the memory bit 12 corresponding to the requested column address. For a write operation, data received by input/output circuitry is coupled to the selected bitline (or bitlines) BL and is stored in memory cell 16 through the FET 14. The information corresponds to binary data (i.e., a logical "1" or "0"). For a read operation, data stored in the selected memory bit 12, represented by the potential state stored in the memory cell 16, is coupled to the selected bitline (or bitlines) BL and amplified by the sense amplifier; a corresponding output is provided to the input/output circuit in the column decoder 28.

The memory array of the memory device 10 may be fabricated using a variety of technologies. One particularly advantageous technique for fabricating the memory bits 12 is now described with reference to FIGS. 2-10. To provide a high density memory device 10, the channel of the FET 14 is fabricated perpendicular to the surface of a wafer (i.e., vertically-oriented) rather than parallel to the surface. Advantageously, the vertically-oriented access FET 14 occupies less space than would be occupied by FETs produced by other techniques.

In addition, by incorporating vertically-oriented access FETs 14, the memory bits 12 are less susceptible to alpha-radiation. The memory bits 12 have increased radiation hardness, and reduced potential for soft errors imparted by alpha particles produced, for example, from packaging materials, over bits with a non-vertically oriented access FET 14.

Figure 2:
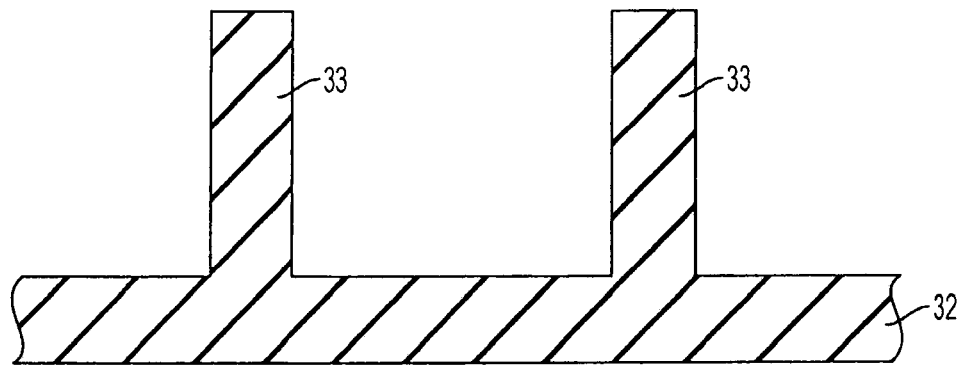
FIGS. 2-10 illustrate steps in the fabrication of memory bits according to an exemplary embodiment of the present invention.

FIG. 2 illustrates a semiconductor substrate 32, made of material such as silicon (Si). More specifically, the substrate 32 is a P-doped silicon. To fabricate the vertically oriented access FETs 14, the substrate 32 is subtractively etched to produce silicon pillars 33. As described further below, the pillars 33 will eventually form the channels of the FETs 14. The pillars 33 may be formed through any one of a number of commonly known etching techniques, such as plasma etching, ion beam etching, or reactive ion etching (RIE). Each pillar 33 has a height of approximately 2.0 µm and a diameter of approximately 0.2 µm, for example. In the present embodiment, each pillar 33 may be generally cylindrical such that the top view of each pillar 33 is generally circular. This shape facilitates the eventual fabrication of annular rings around the pillars 33, as described further below. Alternatively, pillars having other geometric cross-sectional shapes, such as rectangles, squares, or ellipses, may be implemented to construct the channel of the FETs 14.

As can be appreciated, the specific heights and thicknesses of the features and materials described herein are exemplary in nature and for purposes of illustration. Accordingly, the exemplary dimensions provided herein are in no way meant to limit the scope of the present invention. Further, while the present exemplary embodiment illustrates pillars 33 that are perpendicular to the surface of the substrate 32, the pillars 33 may extend away from the surface of the substrate 32 at other angles. For instance, in an alternate embodiment, the pillars 33 may be fabricated at an angle in the range of approximately 45° to approximately 90° with respect to the surface of the substrate 32.

Figure 3:
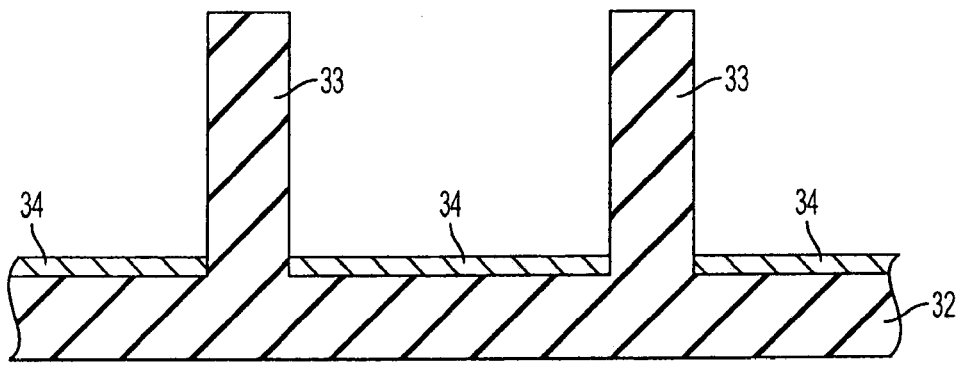

After formation of the pillars 33, an isolation layer, such as an oxide layer 34, is applied on top of the substrate 32, as illustrated in FIG. 3. The isolation layer can include any number of non-conductive materials such as oxide, silicon dioxide, silicon nitride, etc. The oxide layer 34 is applied by chemical vapor deposition (CVD), for example. The oxide layer 34 is disposed at a thickness of approximately 0.2 µm. As can be appreciated by those skilled in the art, the oxide layer 34 is disposed over the entire surface of the substrate 32.

A photoresist is used to facilitate the patterning and etching of the oxide layer 34 such that the oxide layer 34 is not present on top of the pillars 33. It should be understood that those skilled in the art readily understand the deposition, masking, and etching techniques used to construct the patterns illustrated with reference to FIGS. 2-10.

Figure 4:
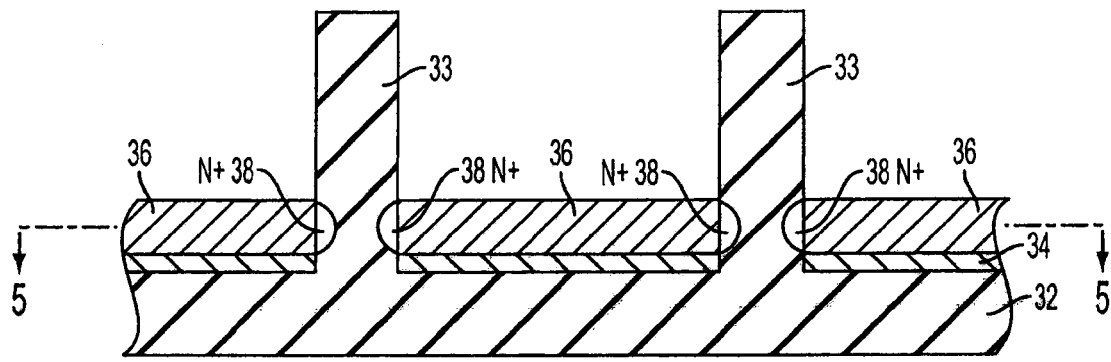

FIG. 4 illustrates the deposition of the material used to create the bitlines BL discussed previously with respect to FIG. 1. A polysilicon layer 36 is disposed on the oxide layer 34. The polysilicon layer 36 can be over-doped such that when the substrate 32 is baked or otherwise heated, the concentration gradient between the polysilicon layer 36 and the substrate 32 will cause dopants to diffuse from the polysilicon layer 36 into the substrate 32, forming n+ contact regions 38 at the silicon/polysilicon interface as illustrated in FIG. 4. The silicon/polysilicon interface generally is near the base of the pillar 33, where the n+ contact regions 38 are formed by so-called "out-diffusion." The contact regions 38 may also be formed using gas diffusion or ion implant techniques. The polysilicon layer 36 may be disposed at a thickness of approximately 0.4 μm, for example.

Figure 5:
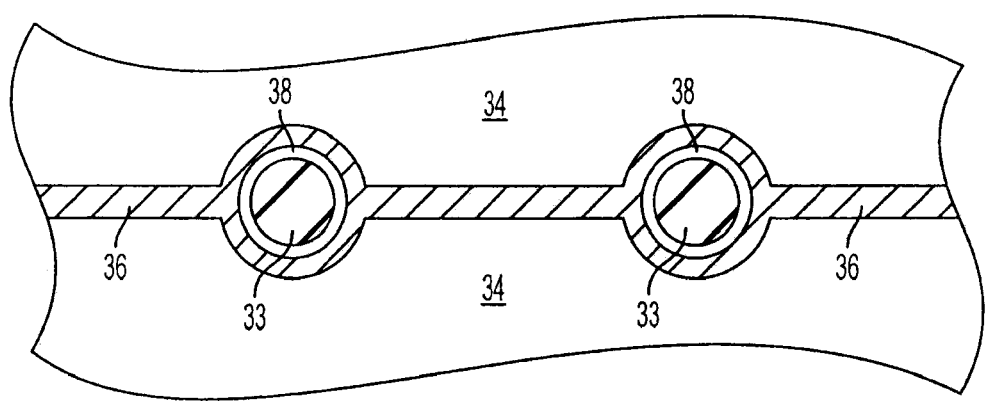

FIG. 5 illustrates a cross-sectional top view of the structure illustrated with reference to FIG. 4 taken along cut lines 5-5. The polysilicon layer 36 is patterned to provide annular rings around the silicon pillars 33. Thus, the polysilicon layer 36, which forms the bitlines BL of the memory array (described with reference to FIG. 1), extends to connect all of the silicon pillars 33 in a given column of the array. As previously described, the silicon pillar 33 also includes n+ contact regions 38 formed from the polysilicon layer 36. Advantages of the annular ring pattern around the silicon pillars 33 used to form the bitline polysilicon layer 36, are discussed below.

Figure 6:
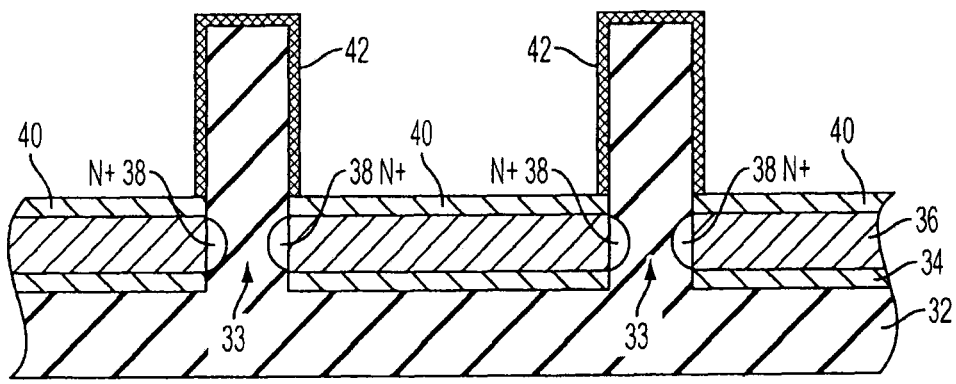

Referring to FIG. 6, after deposition of the polysilicon layer 36 and the formation of the n+ contact regions 38, another isolation layer, such as an oxide layer 40, is disposed on the polysilicon layer 36. The oxide layer 40 electrically isolates the polysilicon layer 36 from layers subsequently disposed over the oxide layer 40. As with the oxide layer 34, the oxide layer 40 is deposited, patterned and etched to provide a structure as illustrated in FIG. 6. The thickness of the oxide layer 36 may be approximately 0.2 μm, for example.

FIG. 6 further illustrates a thin gate oxide layer 42 which is disposed or grown around the pillar 33 to facilitate the functionality of the gate 22 (FIG. 1) of the FET 14. The gate oxide layer 42 may be grown to a thickness of approximately 60 angstroms by any one of a number of conventional techniques. It should be noted that for purposes of etch selectivity, the oxide layer 40 and the gate oxide 42 may comprise different insulated materials with respect to one another, such as oxide, silicon dioxide, silicon nitride, TEOS, etc.

Figure 8:
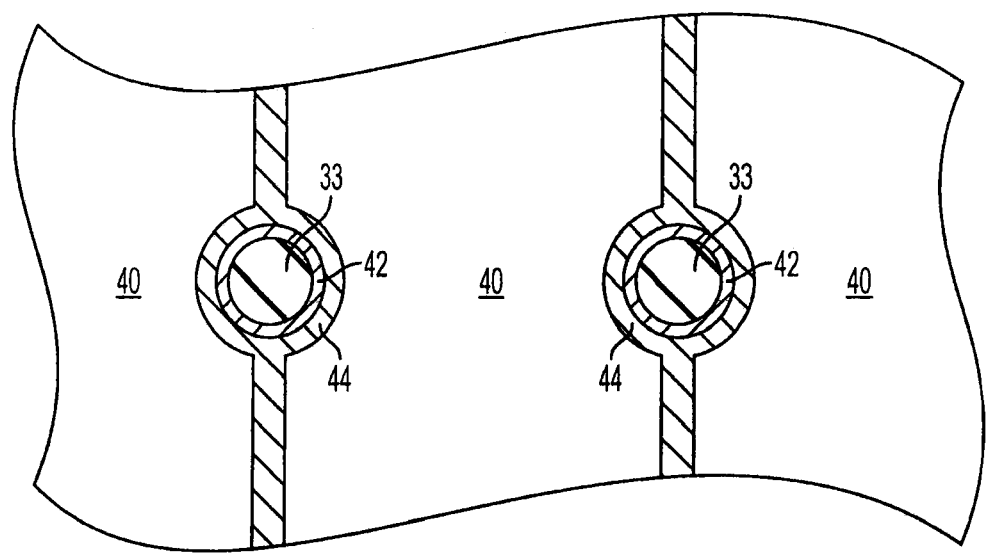
Figure 7:
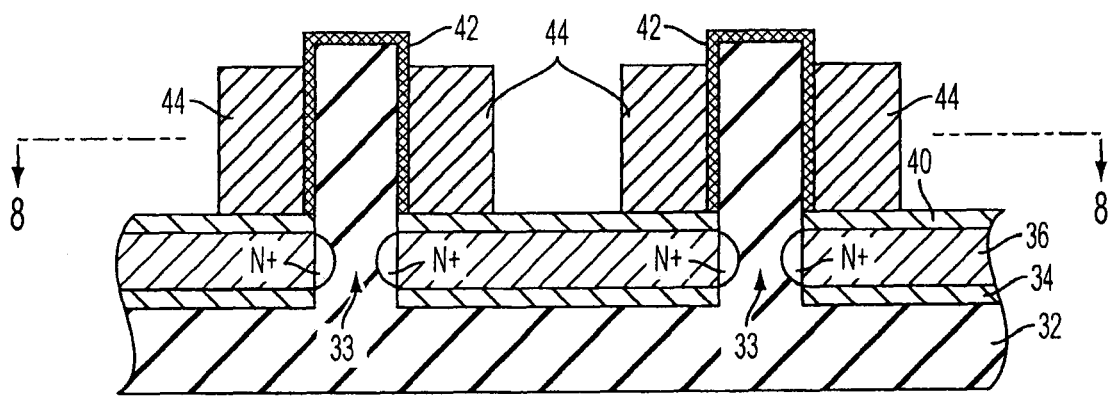

Referring to FIGS. 7 and 8, after the deposition of the oxide layer 40 and the growth of the gate oxide layer 42, another layer of polysilicon is deposited, patterned, and etched to form the wordline polysilicon layer 44. The thickness of the wordline polysilicon layer 44 extending upwardly from the surface of the substrate 32 in the direction of the pillar 33 may be about 0.8 μm, for example. The thickness of the wordline polysilicon layer 44 extending outwardly from the surface of the pillar 33 may be about 0.1 to about 0.2 μm, for example. The wordline polysilicon layer 44 is patterned such that the polysilicon material completely surrounds the pillar 33. As illustrated in FIG. 8, the wordline polysilicon layer 44 is patterned such that it runs perpendicular to the bitline polysilicon layer 36. The advantages of the annular ring pattern around the silicon pillars 33 used to form the wordline polysilicon layer 44 will be discussed further below.

Figure 9:
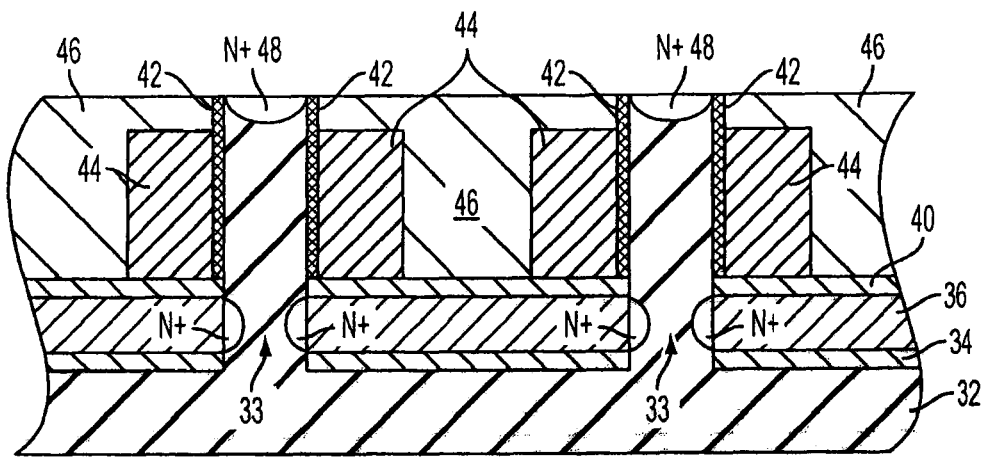

Referring to FIG. 9, after the deposition, patterning, and etching of the wordline polysilicon layer 44, a dielectric layer 46, such as silicon dioxide or silicon nitride, is deposited over the entire structure such that each pillar 33 is covered completely with dielectric material. The dielectric layer 46 may be disposed by chemical vapor deposition (CVD), for example. Thus, the dielectric layer 46 may be deposited to a thickness of more than 1.0 μm, in the present exemplary embodiment, such that the dielectric layer 46 is deposited to a height approximately coplanar with the height of the pillars 33.

After deposition of the dielectric layer 46, the surface of the structure may be planarized such as by chemical-mechanical polishing/planarization (CMP). The surface of the structure is planarized to a point where the thin gate oxide layer 42 is removed from the top of the pillar 33 thereby exposing the silicon pillar 33. Finally, an n+ contact region 48 is formed at the top of the pillar 33. The n+ contact region 48 may be formed through gas diffusion or ion implant techniques, for example. The n+ contact region 48 forms the source 20 (FIG. 1) that will be coupled to the memory cell 16 formed in subsequent processing steps discussed below and illustrated with respect to FIG. 10.

The completed access device (FET 14) is illustrated in FIG. 9. The silicon pillar 33 forms a channel of the FET 14. By completely surrounding the channel (i.e., pillar 33) with the wordline polysilicon layer 44, the gate 22 (FIG. 1) functions as a channel with increased drive capabilities over access devices having conventional gate structures. The annular structure of the bitline polysilicon layer 36 offers advantages of compact layout and efficiency.

Figure 10:
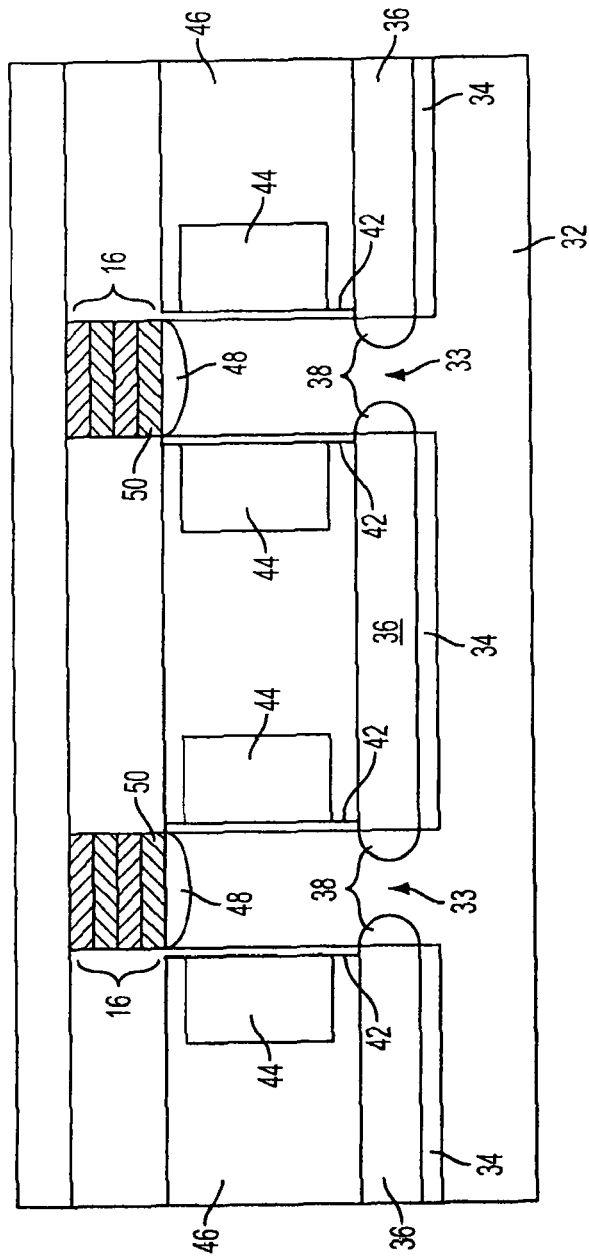

To complete the memory bit 12 (FIG. 1), a storage device, such as the memory cell 16, is fabricated. FIG. 10 illustrates a completed memory bit structure 12 incorporating an exemplary memory cell 16.

One technique for fabricating the memory cell 16 begins by disposing a sacrificial oxide layer (not shown) on top of the structure described above and illustrated with reference to FIG. 9. The oxide layer is disposed at a thickness at least as high as what later will be the height or vertical thickness of the memory cell 16. For instance, the thickness of the sacrificial oxide may be approximately 2.0 μm. Once the sacrificial oxide is deposited, holes are drilled or etched in the oxide to create wells which are vertical with respect to the surface of the substrate. After the wells are created, the layers making up the memory cell 16 may be disposed in the wells. A lowest layer 50 is deposited to make contact with the n+ contact region 48 of the pillar 33. This interface provides the connection of the FET 14 to the memory cell 16.

Memory cell 16 can be fabricated by various methods, depending on the type of memory cell used in the memory device 10. An MRAM cell generally will include a free magnetic layer, a pinned magnetic layer, and a magnetic tunnel junction barrier disposed between the two magnetic layers. A description of MRAM cells in general, and an exemplary method of fabricating MRAM cells, are disclosed in U.S. Pat. No. 6,358,756, issued Mar. 19, 2002 and of common assignment with the present invention, the entire disclosure of which is incorporated herein by reference.

Memory cell 16 also can be a PCRAM cell. A PCRAM cell generally will include a lower contact layer on which is disposed a PCRAM bit. PCRAM bits are resistance variable memory elements in which a metal containing layer is formed between a first chalcogenide glass layer and a second glass layer. One or both of the glass layers may be doped with a metal and one or more metal containing layers may be provided between the glass layers. An exemplary method of manufacturing a PCRAM cell is disclosed in pending U.S. patent application Ser. No. 10/120,521, filed Apr. 12, 2002 and of common assignment with the present invention, the entire disclosure of which is incorporated herein by reference.

Figure 11:
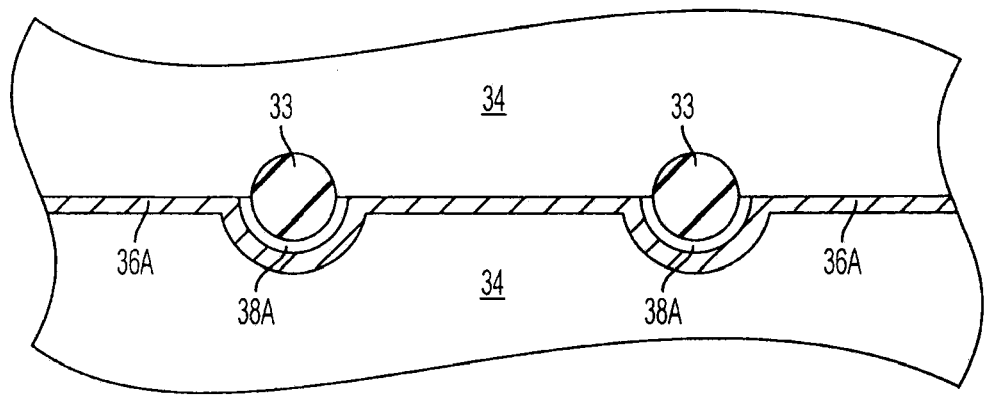
FIG. 11 illustrates an alternative embodiment of forming a bit line in a memory bit according to the present invention.

FIG. 11 illustrates a bitline BL according to another embodiment of the invention. More specifically, FIG. 11 illustrates a cross-sectional top view of an alternate embodiment of the structure illustrated with reference to FIG. 4 taken along cut lines 5-5. As can be seen, a polysilicon layer 36A is patterned to provide semi-annular rings around the silicon pillars 33. The polysilicon layer 36A, which forms the bitlines of the memory array described with reference to FIG. 1, extends to connect each of the silicon pillars 33 in a single column. As previously described, the silicon pillar 33 also includes n+ contact regions 38A which may be formed by out diffusion from the polysilicon layer 36A. Thus, the present exemplary embodiment provides a polysilicon layer 36A which is patterned to surround only a portion of the pillar 33. Advantageously, the alternate exemplary embodiment illustrated with reference to FIG. 11 may provide for further pitch reduction and thus, reduction in the area of each memory bit and overall die size.

Figure 12:
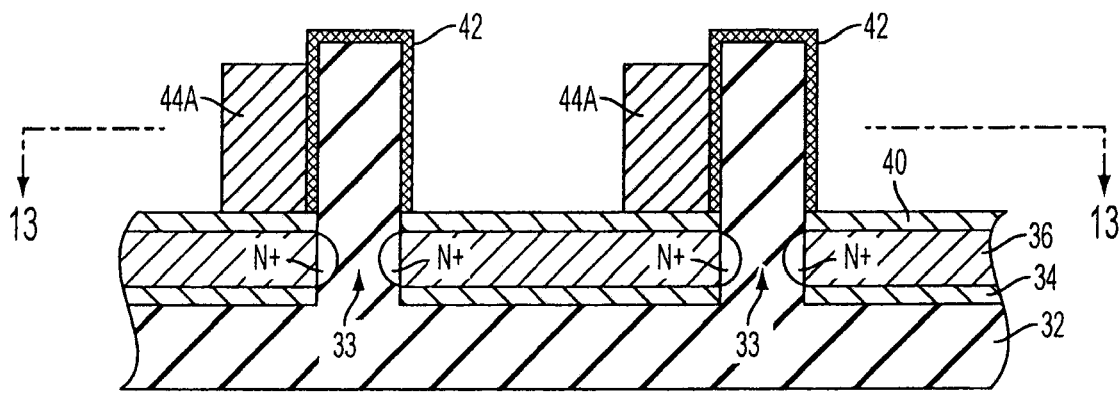
FIG. 12 is an alternative view of the bit line of FIG. 11.
Figure 13:
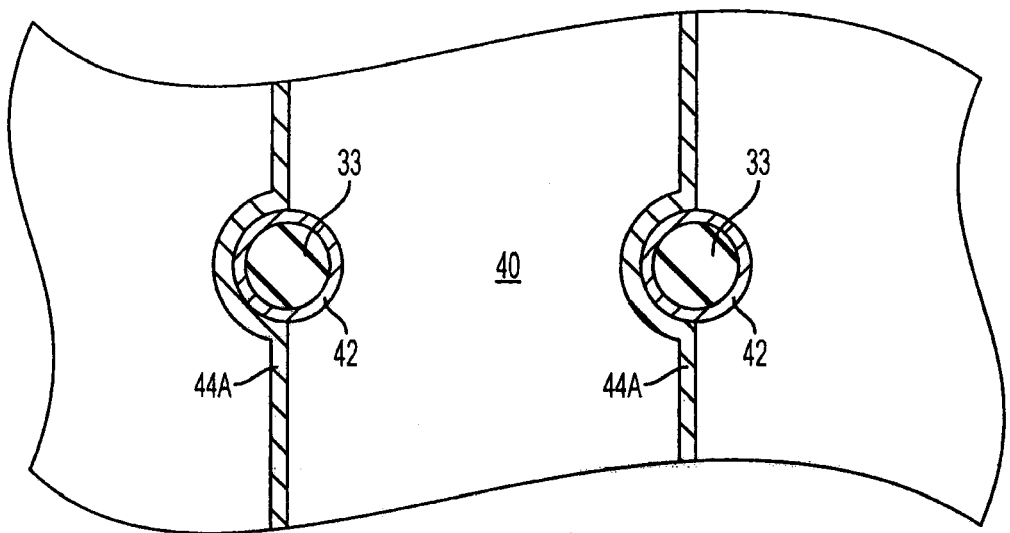
FIG. 13 is a cross-sectional view of the bit line shown in FIGS. 11 and 12.

Similarly, the wordline WL, may be patterned to provide a semi-annular ring. FIGS. 12 and 13 illustrate an alternate embodiment of the wordline WL, incorporating semi-annular rings. FIG. 12 illustrates an alternative view of the structure illustrated in FIG. 7. Thus, after the deposition of the oxide layer 40 and the growth of the gate oxide layer 42, a polysilicon layer is disposed, patterned and etched to form the polysilicon layer 44A having semi-annular rings. The wordline polysilicon layer 44A extends in a direction perpendicular to the page and thus, the view of the structure illustrated in FIG. 12 includes the polysilicon layer 44A on only one side of the pillar 33. However, the wordline polysilicon layer 44A is patterned about a portion of the pillar 33, as further illustrated with respect to FIG. 13.

FIG. 13 illustrates a cross-sectional top view of the alternate embodiment illustrated in FIG. 12 taken along cut line 13-13. As can be seen, the wordline polysilicon layer 44A is patterned to provide semi-annular rings around the silicon pillars 33. The wordline polysilicon layer 44A is patterned such that it runs perpendicular to the bitline polysilicon layer 36. The semi-annular wordline polysilicon layer 44A may be implemented along with the semi-annular bitline polysilicon layer 36A described with reference to FIG. 11. Further, while FIGS. 11-13 illustrate semi-annular rings, it should be evident that an annular ring may extend around any desirable portion (e.g., more than or less than half) of the pillar 33. For instance, it may be advantageous to provide annular rings that extend around only a quarter to a third of the circumference of the pillar 33. Alternatively, it may be advantageous to provide annular rings that extend around two-thirds to three-quarters of the circumference of the pillar 33, for example.

Figure 14:
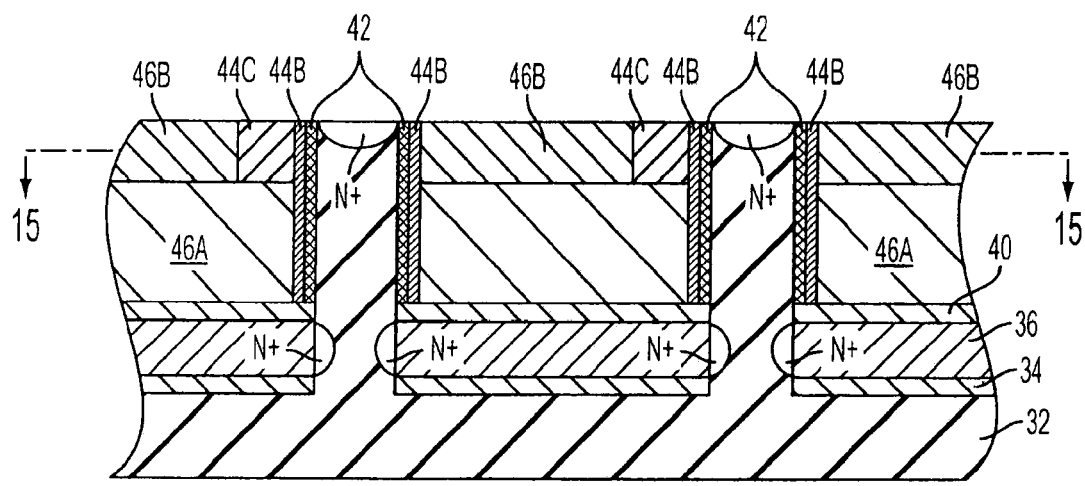
FIG. 14 illustrates an alternative form of a word line in a memory bit according to the present invention.
Figure 15:
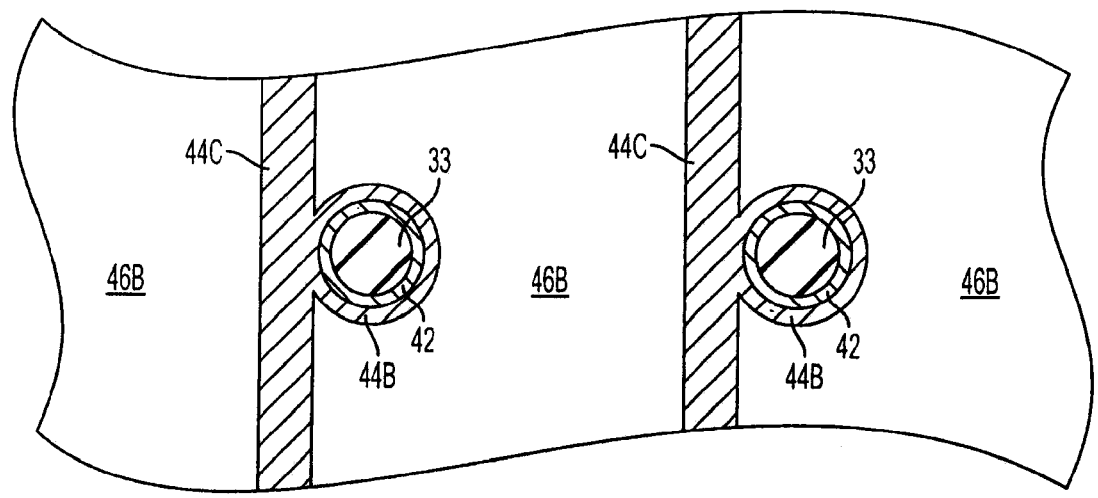
FIG. 15 is a cross-sectional view of the word line structure of FIG. 14.

FIG. 14 illustrates an alternate embodiment of the structure illustrated in FIG. 9, implementing an alternate technique for fabricating the wordline WL. FIG. 15 illustrates a cross-sectional top view of the alternate embodiment illustrated in FIG. 14 taken along the cut line 15-15. In the present exemplary embodiment, the wordline polysilicon layer 44 is replaced with a thin gate conductor layer 44B and a thick signal conductor layer 44C. As can be seen, the thin gate conductor layer 44B completely surrounds the pillar 33. The thin gate conductor layer 44B may have a thickness extending from the surface of the pillar 33 of less than 0.1 μm, for example. After the deposition, patterning and etching of the thin conductor layer 44B, a dielectric layer 46A may be disposed. Unlike the embodiment illustrated in FIG. 9, however, the dielectric layer 46A is not disposed to cover the entire pillar 33. The dielectric layer 46A is disposed such that a portion of the pillar remains uncovered, as illustrated in FIG. 14.

Next, the thick signal conductor layer 44C is disposed, patterned and etched to form the wordline WL. The gate conductor layer 44B is electrically coupled to the signal conductor layer 44C. In one exemplary embodiment, the gate conductor layer 44B and the signal conductor layer 44C are each polysilicon layers. However, as can be appreciated, the gate conductor layer 44B and the signal conductor layer 44C may be different materials. For instance, the gate conductor layer 44B may be a polysilicon layer, while the signal conductor layer 44C may be a tungsten layer. To complete the structure, a dielectric layer 46B may be disposed to a thickness sufficient to cover the pillars 33, and the surface of the structure may be planarized, as previously described. Advantageously, by providing a thin gate conductor layer 44B coupled to a thick signal conductor layer 44C, a smaller pitch between structures may be implemented, thereby reducing cell size and overall die size.

As can be appreciated, while the present wordline and bitline structures are described as being fabricated through deposition techniques, other processes, such as a damascene process may implemented to form the wordlines and bitlines in accordance with the present techniques. Further, while the present exemplary embodiments have illustrated the annular gate structures with respect to DRAM memory devices, the present techniques may be implemented in a number of other applications, such as flash memory cells, SRAM memory cells, anti-fuse devices, image sensors and simple logic gates, for example.

Figure 16:
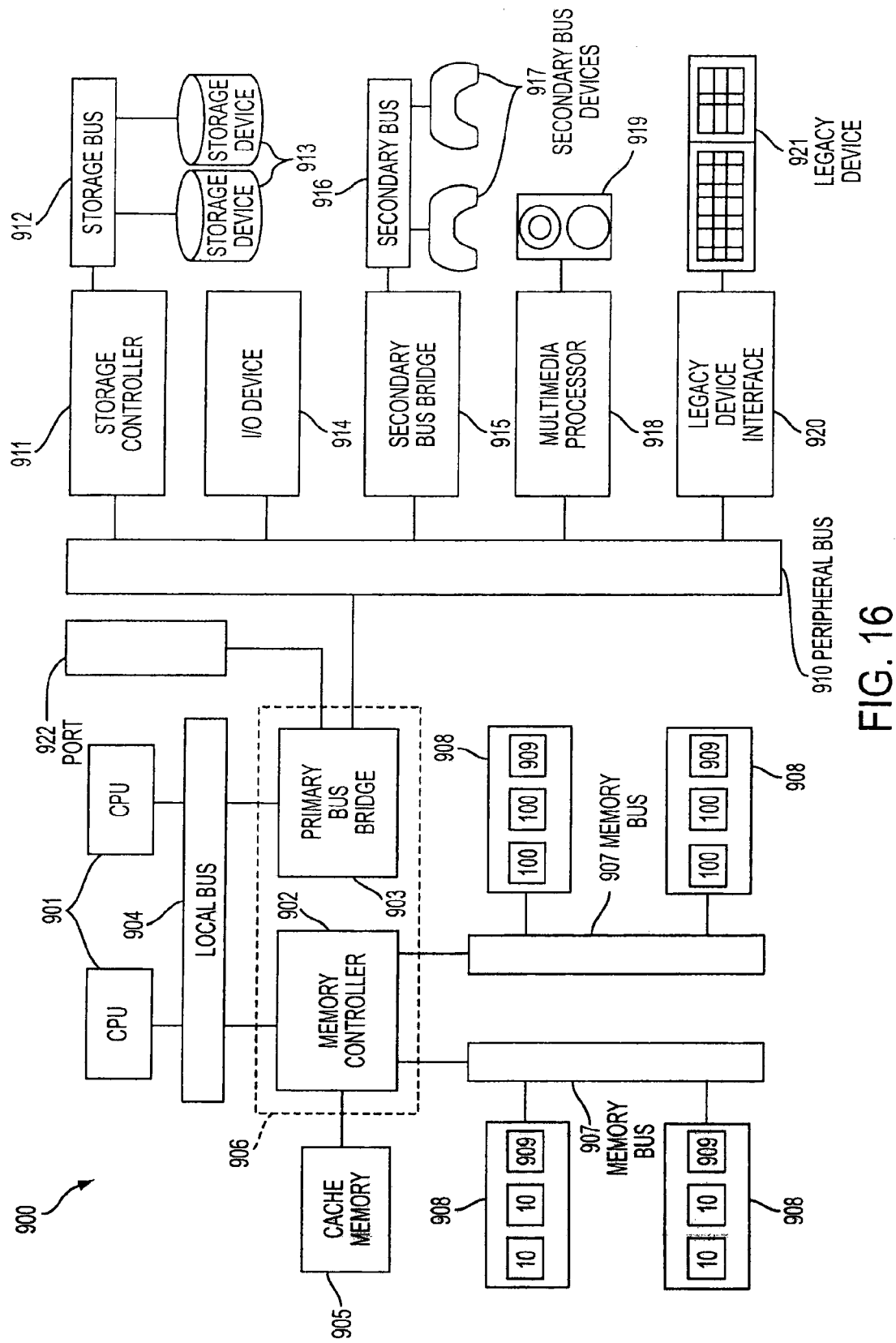
FIG. 16 is a processor system including memory device according to the embodiment of the present invention.

FIG. 16 illustrates an exemplary processing system 900, which may incorporate memory devices 10 of the present invention into one of more of the memory modules 908 described below. The processing system 900 includes one or more processors 901 coupled to a local bus 904. A memory controller 902 and a primary bus bridge 903 also are coupled to local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, a miscellaneous I/O device 914, a secondary bus bridge 915 communicating with a secondary bus 916, a multimedia processor 918, and a legacy device interface 920. The primary bus bridge 903 may also coupled to one or more special purpose high speed ports 922. In a personal .computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be a local area network interface, such as an Ethernet card. The secondary bus bridge 915 may be used to interface additional devices via another bus to the processing system. For example, the secondary bus bridge may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple at least one legacy device 921, for example, older styled keyboards and mice, to the processing system 900.

The processing system 900 illustrated in FIG. 16 is only an exemplary processing system with which the invention may be used. While FIG. 16 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. An integrated circuit device comprising:
an access device, the access device comprising:
a semiconductor pillar comprised of a semiconductor material having a doped region formed in the semiconductor pillar at an end of the semiconductor pillar, and
a semi-annular ring disposed about a portion of the semiconductor pillar, wherein the semi-annular ring comprises a conductive material; and
a memory cell being in contact with the doped region.

2. The integrated circuit device of claim 1, wherein the semi-annular ring is disposed about approximately half of the semiconductor pillar.

3. The integrated circuit device of claim 1, wherein the semi-annular ring is disposed about approximately one-third of the semiconductor pillar.

4. The integrated circuit device of claim 1, wherein the semi-annular ring is disposed about approximately three-quarters of the semiconductor pillar.

5. The integrated circuit device of claim 1, wherein the semiconductor pillar is cylindrical in shape.

6. The integrated circuit device of claim 1, wherein the semiconductor pillar is geometric in shape.

7. The integrated circuit device of claim 1, wherein the semiconductor pillar is circular in shape.

8. An integrated circuit device comprising:
an access device comprising:
a pillar of semiconductor material having a first doped region formed in the semiconductor pillar at a first end of the pillar and having a second doped region formed in the semiconductor material at a second end of the pillar,
a first semi-annular ring disposed about a portion of the pillar, the first semi-annular ring comprising a conductive material; and
a second semi-annular ring disposed about another portion of the pillar and directly adjacent to the second doped region, the second semi-annular ring being electrically isolated from the first semi-annular ring, wherein the second semi-annular ring comprises a conductive material; and
a memory cell in contact with the first doped region.

9. The integrated circuit device of claim 8, wherein the pillar extends away from a surface of a substrate in a perpendicular direction.

10. The integrated circuit device of claim 8, wherein the pillar extends away from a surface of a substrate in an approximately 45 degree direction.

11. The integrated circuit device of claim 8, wherein the pillar extends away from a surface of a substrate in an angular direction between 45 degrees and 90 degrees.

12. An integrated circuit device comprising:
an access device comprising:
a pillar of semiconductor material having a doped region formed in the semiconductor pillar;
a first semi-annular ring disposed about approximately half of the pillar, the first semi-annular ring comprising a conductive material; and
a second semi-annular ring disposed about approximately another half of the pillar, the second semi-annular ring being electrically isolated from the first semi-annular ring, wherein the second semi-annular ring comprises a conductive material; and
a memory cell in contact with the doped region.

13. The integrated circuit device of claim 12, wherein the second semi-annular ring is coupled to a bitline of a memory array.

14. The integrated circuit device of claim 12, wherein the memory cell is formed at the end of the semiconductor pillar.

15. An integrated circuit device comprising:
an access device comprising:
a substrate having a surface;
a pillar of semiconductor material extending from the substrate surface and having a doped region formed in the semiconductor pillar;

a first semi-annular ring disposed about at least a portion of the pillar, the first semi-annular ring comprising a conductive material; and a second semi-annular ring disposed about at least another portion of the pillar, wherein the second semi-annular ring being electrically isolated from the first semi-annular ring and being more proximate to the substrate surface than the first semi-annular ring, the second semi-annular ring comprising a conductive material; and a memory cell in contact with the first doped region.

16. The integrated circuit device of claim 15, wherein the pillar is configured to form a channel of a transistor and the first doped region is configured to form one of the drain and source of the transistor and the second doped region is configured to form the other of the drain and source of the transistor.

17. The integrated circuit device of claim 15, wherein the first semi-annular ring is configured to form a gate of the transistor and further configured to induce conduction through the pillar between the first doped region and the second doped region when a voltage is applied to the first at least semi-annular ring.

18. The integrated circuit device of claim 15, wherein the first semi-annular ring is coupled to a wordline of a memory array.

19. The integrated circuit device of claim 15, further comprising a storage device coupled to the first doped region.

20. The integrated circuit device of claim 19, wherein the storage device comprises a crown type storage capacitor.

* * * * *